(12) United States Patent
Walford et al.

(10) Patent No.: US 7,186,486 B2
(45) Date of Patent: Mar. 6, 2007

(54) METHOD TO PATTERN A SUBSTRATE

(75) Inventors: Jonathan Walford, Solna (SE); Per Askebjer, Åkersberga (SE); Robert Eklund, Stockholm (SE)

(73) Assignee: Micronic Laser Systems AB, Taby (SE)

( * ) Notice: Subject to any disclaimer, the term of this patent is extended or adjusted under 35 U.S.C. 154(b) by 346 days.

(21) Appl. No.: 10/634,152

(22) Filed: Aug. 4, 2003

(65) Prior Publication Data

US 2005/0032002 A1     Feb. 10, 2005

(51) Int. Cl.
*G03F 9/00* (2006.01)
*G03C 5/00* (2006.01)

(52) U.S. Cl. .................. 430/30; 430/302; 430/312; 430/328

(58) Field of Classification Search .............. 430/30, 430/302, 312, 328
See application file for complete search history.

(56) References Cited

U.S. PATENT DOCUMENTS

| | | |
|---|---|---|
| 4,879,605 A | 11/1989 | Warkentin et al. |
| 5,103,101 A | 4/1992 | Berglund et al. |
| 5,148,157 A | 9/1992 | Florence |
| 5,467,146 A | 11/1995 | Huang et al. |
| 5,774,254 A | 6/1998 | Berlin |
| 5,835,256 A | 11/1998 | Huibers |
| 6,142,641 A | 11/2000 | Cohen et al. |
| 6,285,488 B1 | 9/2001 | Sandstrom |
| 6,348,907 B1 | 2/2002 | Wood |
| 6,504,644 B1 | 1/2003 | Sandstrom |
| 6,717,097 B1 | 4/2004 | Sandstrom et al. |
| 2001/0040670 A1 | 11/2001 | Fielding |
| 2005/0053850 A1* | 3/2005 | Askebjer et al. ............... 430/5 |

FOREIGN PATENT DOCUMENTS

| WO | WO 01/18606 | 3/2001 |
|---|---|---|
| WO | WO 01/93303 A2 | 12/2001 |

* cited by examiner

*Primary Examiner*—Christopher G. Young
(74) *Attorney, Agent, or Firm*—Ernest J. Beffel, Jr.; Haynes Beffel & Wolfeld LLP

(57) ABSTRACT

An aspect of the present invention includes a method of lithography to enhance uniformity of critical dimensions of features patterned onto a workpiece. Said workpiece is coated with a coating sensitive to electromagnetic radiation. An electromagnetic radiation source having an illumination intensity is provided. At least one object pixel of electromagnetic radiation is created. A predetermined pattern is exposed, by using said at least one object pixel, on at least a portion of said workpiece in a first exposure pass with a first dose to provide less than full exposure of said coating sensitive to electromagnetic radiation. Said exposing action is repeated at least until said portion of said coating sensitive to electromagnetic radiation is fully exposed, wherein said dose is increased for every following pass. Said fully exposed coating sensitive to electromagnetic radiation is developed.

17 Claims, 3 Drawing Sheets

METHOD TO PATTERN A SUBSTRATE

TECHNICAL FIELD

The present invention relates to a method for patterning a workpiece in a lithographic process, in particular it relates to a method for improving the critical dimension uniformity.

BACKGROUND OF THE INVENTION

Semiconductor devices include multiple layers of structure. The structures are formed in numerous steps, including steps of applying resist, then exposing, developing and selectively removing the resist to from a pattern of exposed areas. The exposed areas may be etched to remove material or sputtered to add material. A critical part of forming the pattern in the resist is exposing it. Resist is exposed to an energy beam that changes its chemical properties.

One way of exposing the resist is with a stepper. The stepper uses a reticle, which typically includes a carefully prepared, transmissive quartz substrate overlaid by a nontransmissive or masking layer that is patterned with areas to be exposed and areas to be left unexposed. Patterning is an essential step in the preparation of reticles. Reticles are used to manufacture semiconductor and other devices, such as flat panel displays and television or monitor screens.

More recently, the need to manufacture integrated circuits by means other than using a conventional mask has developed for a number of reasons, for example the price of manufacturing mask(s) has increased due to its complexity to manufacture, small-scale development which needs very small series of integrated circuits, etc.

SLM writers disclosed in other patent applications, such as WO 01/18606, is related to raster scanning in the sense that it permits a bitmap pattern, but distinct by printing an entire frame of pattern in one flash instead of building the pattern from individual pixels.

A spatial light modulator (SLM) comprises a number of modulator elements, which can be set in a desired way for forming a desired pattern. Reflective SLMs may be exposed to any kind of electromagnetic radiation, for example DUV or EUV for forming the desired pattern on the mask.

The pattern on the reticle used to produce semiconductor devices is typically four times larger than that on a wafer being exposed. Historically, this reduction factor has meant that minimum feature dimensions in the reticles are less critical than the minimum feature dimensions on a surface of the semiconductor. However, a difference in criticality is much less than might be expected and will in the near future disappear.

Critical dimension uniformity (CD uniformity), as a percentage of the line width, is more exacting in the pattern on a reticle than in features on a surface of the wafer. CD uniformity refers to the minimization of variation of a single critical dimension at different points within the pattern. In other words, as the difference in actual dimension of features having the same critical dimension decreases within the pattern, CD uniformity increases. On the wafer, critical dimension uniformity of plus or minus 10 percent of the line width has historically been acceptable. In the error budget for the wafer line width, the mask has been allowed to contribute half of the critical dimension variation, or a variation of five percent of a line width. Other factors use the remaining error budget.

It is anticipated that requirements for critical dimension uniformity will tighten in time, particularly for masks. On the surface of the wafer, a critical dimension uniformity of plus or minus five percent of the line width will be required in the future. At the same time, the mask error enhancement factor is likely to increase due to more aggressive lithographic process trade-offs, such as tuning the lithographic process to optimize the manufacture of contact holes, transistors or other critical features in order to use feature sizes closer to the theoretical resolution limit. For masks, a critical dimension uniformity of plus or minus one percent of a line width or feature size is anticipated. At this rate, the tolerance for critical dimension errors on the mask will be smaller in absolute nanometers than it is on the surface of the wafer, despite the fact that the stepper takes advantage of a mask that is four times as large as the area on the wafer that is being exposed.

Thus, it is desirable to develop a new method for patterning reticles or wafers, which will further reduce the critical dimension variation.

SUMMARY OF THE INVENTION

Accordingly, it is an object of the present invention to provide a method of producing small features on a substrate with precise critical dimension.

This object, among others, is according to a first aspect of the invention attained by a method of lithography for enhancing uniformity of critical dimensions of features patterned onto a workpiece using a multipass writing strategy, the method including coating said workpiece with a coating sensitive to an energy beam, providing an energy beam source, determining an individual dose for each pass so that each pass will affect said coating essentially equal, thereby enhancing said uniformity of critical dimension, exposing said coating in said multipass writing strategy by using said individual dose for each pass, developing said coating.

Further characteristics of the invention, and advantages thereof, will be evident from the detailed description of preferred embodiments of the present invention given hereinafter and the accompanying FIGS. 1–4, which are given by way of illustration only, and thus are not limitative of the present invention.

DETAILED DESCRIPTION

The following detailed description is made with reference to the figures. Preferred embodiments are described to illustrate the present invention, not to limit its scope, which is defined by the claims. Those of ordinary skill in the art will recognize a variety of equivalent variations on the description that follows.

Figure 1:
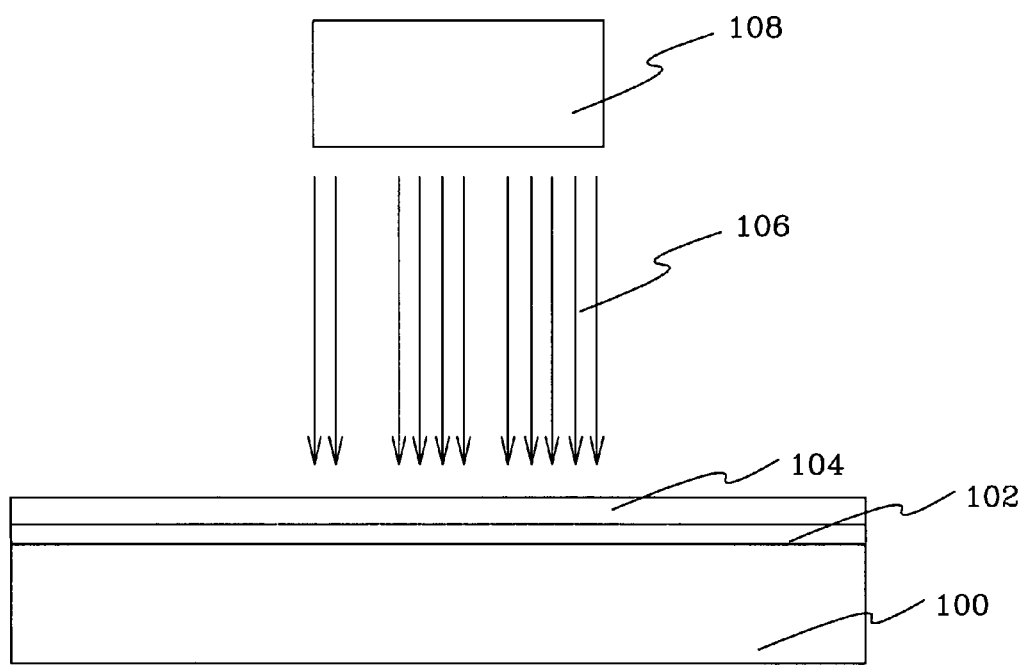
FIG. 1 depicts schematically in a side view a mask substrate coated with a resist layer and a pattern generator for exposing said resist.

FIG. 1 depicts a coated substrate 100 comprising a masking or non-transmissive layer 102 and a resist layer 104. The substrate 100 may be a quarts substrate, an Erodent ceramic substrate or an ULE™ glass substrate when said substrate is to be a reticle or mask. However, when making integrated circuits by direct writing, said substrate may by any kind of semiconducting material. In such case the resist is applied directly onto said substrate.

The mask is formed over the transmissive substrate to block the passage of an energy beam in areas where resist on a wafer are intended not to be exposed. Unmasked portions of the substrate 100 allow an energy beam to pass through and form a pattern on the wafer resist.

The non-transmissive masking layer 102 typically includes a chrome layer approximately 40–90 nm thick. Said chrome material may be applied by sputtered deposition. Alternatively, aluminum, gold, tungsten, or silicon could be used to form the non-transmissive, masking layer.

The resist layer, or radiation sensitive coating, may be spun on using conventional techniques to form a layer approximately 0.05–0.20 micron thick. Said resist could be a positive resist or a negative resist. Resists used with photon energy may be referred to as photo resists. Other types of resist are used with other forms of energy, such as electrons, atoms etc. The radiation or energy 106 may be any of wide variety of types. Photon energy may be in the UV, the DUV, EUV, or x-ray spectrum ranges. For instance, photon energy may be generated by a helium cadmium source (approximately 442 and 325 nm) a krypton ion source (approximately 413 nm). Photon energy may also be generated by an excimer source or a krypton-fluoride or an argon-fluoride laser (approximately 308, 248, 193, 157 or 126 nm). The resist may be a chemically amplified resist (CAR), for example DX 1100 from Clariant. The resist may also be a traditional positive or negative non-amplified resist such as Novolac. Other examples of resists are FEP 160 or 171 from Fujifilm.

Exposure of the resist is performed by using a pattern generator. For photon energy, a laser pattern generator or an interference lithography system may be used. For electrons, an electron-scanning device may be used. Etec, a subsidiary of Applied materials, sells an ALTA™ line of scanning laser pattern generators. Micronic laser systems of Täby, Sweden sells Omega™ line of scanning laser systems and Sigma™ line of micromirror-based systems. The NanoStructures Laboratory, working with the University of Wisconsin in some aspects, has described interference lithography systems with spatial periods of 200 nm, 100 nm, and 50 nm.

Object pixel 108 in FIG. 1 may therefore be a reflected radiation from a micromirror in an SLM, a beam spot from a scanning laser system, an electron beam, x-ray beam etc.

It has been experimentally shown that an earlier writing pass with a specific writing dose will affect the resist more than a later writing pass with the same dose. A perturbation in a first writing pass will have a greater impact than the same perturbation in a second or later writing pass. In a multipass writing strategy where the different passes are at least partially superimposing each other, said effect may also be more or less pronounced in that a regular pattern may be seen. Said regular pattern may correspond to such areas in the first writing pass where sub patterns are overlapping. Another effect of the fact that later writing passes with the same dose, as earlier writing passes will affect the resist less than the earlier writing passes is that butting errors may be more or less pronounced. CD uniformity may depend on which writing pass a particular pattern is butted. When creating a complete pattern utilizing a micro mirror device (SLM) to generate said pattern to be printed onto the substrate, several stamps of numerous object pixels are stitched together in each writing pass. Said stamps may be partially overlapped in butting regions. If using the same dose in each writing pass, a characteristic pattern may emerge representing butting areas from the first writing pass.

Figure 3:
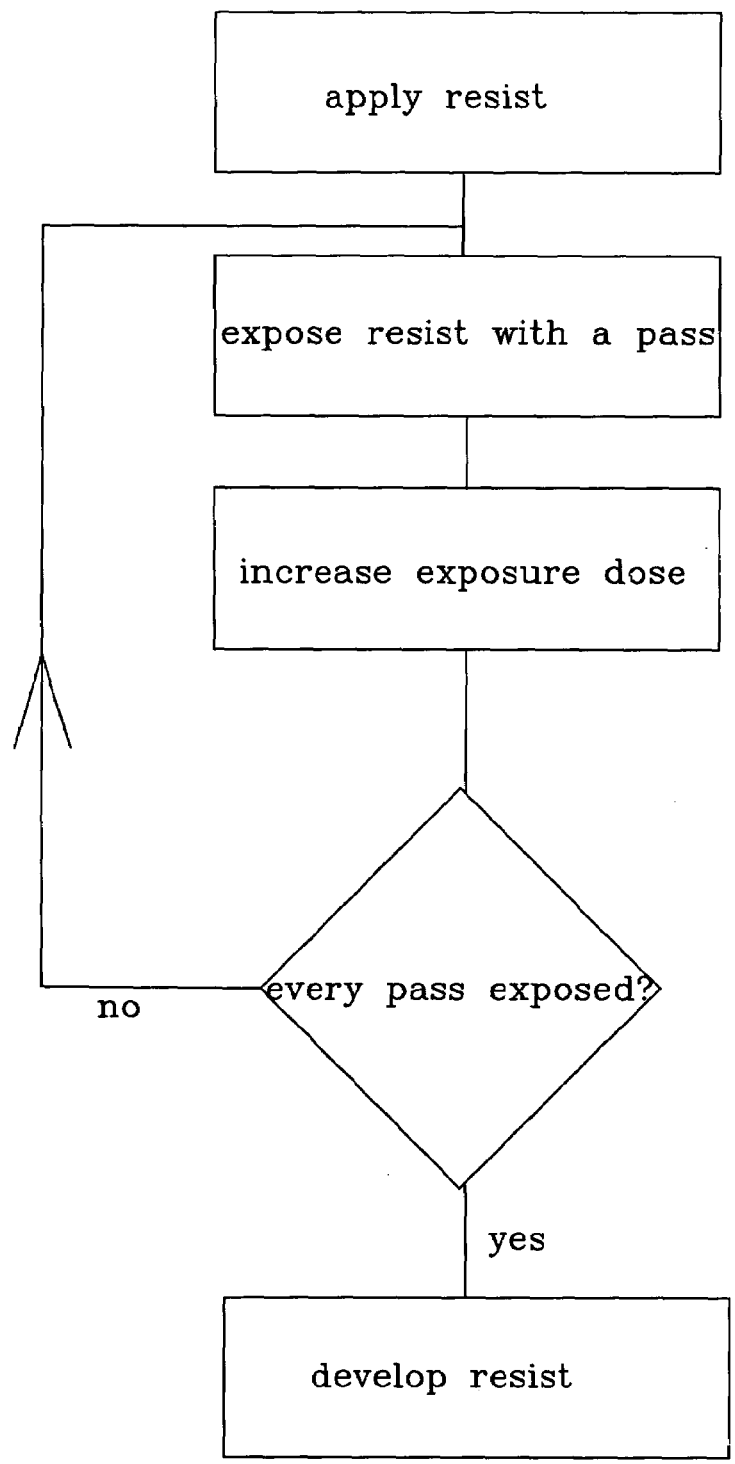
FIG. 3 depicts a flow chart of an embodiment of exposing a substrate according to the present invention.

FIG. 3 illustrates a flow chart of an embodiment of patterning a workpiece according to the present invention. In a first action the resist, electromagnetic sensitive coating or coating sensitive to particular particles, is applied onto the substrate according to conventional techniques well known for anyone with ordinary skill in the art. In a second action said resist is exposed with a first pass having a given exposure dose. There are different ways of patterning a substrate using multi pass strategy. A first way is to pattern a first portion with every pass immediately after each other before starting to expose another portion with every pass. Another way would be to first expose the complete wafer or substrate with the first exposure pass, and when finished, starting all over again from start position with the following pass. This is continued until the full wafer is fully exposed. Instead of starting from start position, every second pass could be exposed in the reversed direction. It is also possible to randomize the portion, which is to be exposed.

Before starting with the second exposure the dose, which is going to expose the resist, is increased. The increase of dose is preferably chosen out of the resist, which is going to be patterned, and the number of passes, which is going to complete a full exposure. The dose may be increased or decreased between every pass, which means that every pass, which is to be exposed, will have a higher/lower exposure dose than the pass just exposed. After having fully exposed the workpiece, said workpiece is developed according to well-known techniques.

An operator operating the pattern generator, which is used for exposing the substrate, could manually set the increase of dose between passes. Said increase of dose could also be stored and chosen automatically by the machine after having given information of what kind of resist is going to be exposed and what the number of passes the operator wishes to use. If the operator is not satisfied with the automatically chosen exposure doses for the different passes he or she might change one or a plurality of them.

Figure 2:
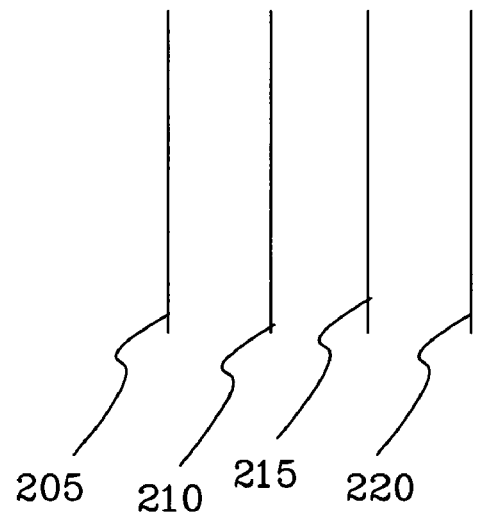
In FIG. 2, four lines are exposed using 4 writing passes.

The actual dose for each pass may according to one embodiment of the present invention be chosen to optimize the critical dimension uniformity. Said doses are most likely different for different resists or emulsions and have to be experimentally verified. One way of determining the optimal dose for each writing pass in a multi pass writing strategy for optimizing the critical dimension uniformity may be as follows. In FIG. 2 four lines are to be exposed using 4 writing passes. In a state of the art 4 pass writing strategy each pass is given the same dose, i.e., 25% of an exposure threshold. The exposure of the resist is a cumulative effect, which means that one can chose between applying the full dosage in a single writing pass or divide said dosage in a number of writing passes. The multiple writing strategy is to prefer since said strategy evens out defects in one or a plurality of the writing passes. For a particular resist the exposure takes place when a certain dose has been impinged onto said resist. Below the exposure threshold no exposure takes place. The transition from unexposed to exposed is relatively sharp and well defined.

One way to determine the effect of each pass is to introduce a perturbation in each pass and see how said perturbation affects the CD. In a first writing pass said perturbation is assigned to a first line 205. The perturbation could be a change in dose or a change in dimension of the line. Imagine that said perturbation is a small dose variation, for instance an increase of 2%. In the first writing pass the first line is exposed with 27% of the exposure threshold, and a second line 210, a third line 215 and a fourth line 220 are exposed with 25% of the exposure threshold. In a second writing pass said perturbation is assigned to the second line 210. In a third writing pass said perturbation is assigned to the third line 215, and in a fourth writing pass said perturbation is assigned to the fourth line 220.

Figure 4:
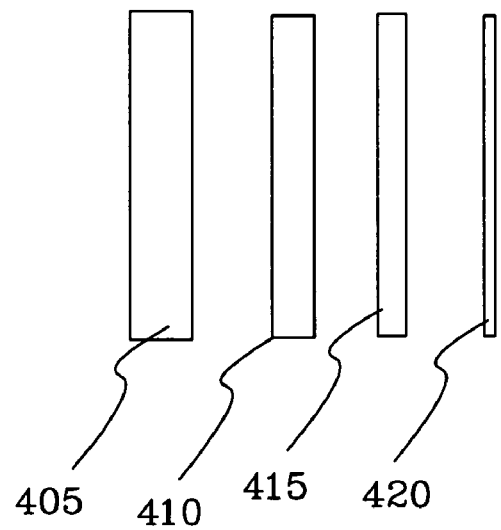
FIG. 4 illustrates four lines exposed to varying doses.

Having completed said four exposures of said four lines, where one line is distorted in each writing pass, a CD measurement is performed for said lines. FIG. 4 illustrates said four lines after exposure. The width of the lines are somewhat exaggerated for reason of clarity only. From said figure it is apparent that the first line 405 is having a higher CD than the second line 410, the second line 410 is having a higher CD than the third line 415 and the third line 415 is having a higher CD than the fourth line 420. This illustrates that the perturbation affects a pattern more if said perturbation is introduced in an earlier writing pass than in a later writing pass, given that the writing dose is assumed to be equal for each writing pass.

There is a close relationship between the change in critical dimension and the applied dose. Said relationship could be expressed as $\Delta CD \approx k \ast \Delta dose$, where CD is expressed in terms of nm, k is a constant and dose is expressed in terms of percentage of the exposure threshold. The constant k at isofocal dose is for Clariant DX1100 approximately 1.5.

Given the relationship between the change in CD and the change in dose it is possible to predict an optimal dose distribution out of the CD measurement above. To optimize the CD uniformity one wants each pass to affect the resist equally, i.e., introducing a perturbation in any of the writing passes should give rise to the same effect.

For DX 1100 a dose distribution giving optimal CD uniformity when using four pass writing strategy is 20% in the first writing pass, 23.3% in the second writing pass, 26.7% in the third writing pass and 30% in the fourth writing pass.

While the present invention is disclosed by reference to the preferred embodiments and examples detailed above, it is understood that these examples are intended in an illustrative rather than in a limiting sense. It is contemplated that modifications and combinations will readily occur to those skilled in the art, which modifications and combinations will be within the spirit of the invention and the scope of the following claims.

The invention claimed is:

1. A method of lithography for enhancing uniformity of critical dimensions of features patterned onto a workpiece using a multipass writing strategy, the method comprising the actions of:
   coating said workpiece with a coating sensitive to an energy beam,
   providing an energy beam source,
   determining an individual dose for each pass so that each pass will affect said coating essentially equal, thereby enhancing said uniformity of critical dimension,
   exposing said coating in said multipass writing strategy by using said individual dose for each pass,
   developing said coating.

2. The method according to claim 1 further comprising the action of:
   creating said features by a spatial light modulator.

3. The method according to claim 1, wherein said energy beam source is a electromagnetic radiation source emitting pulsed radiation in the range of EUV-DUV.

4. The method according to claim 1, further comprising the action of:
   creating said features by a modulator and deflector arrangement capable of deflecting and setting the intensity of said radiation beam.

5. The method according to claim 1, further comprising the action of:
   creating said features by a diffraction grating.

6. The method according to claim 1, wherein said method comprises 2 exposure passes, of which a first exposure pass has a dose less than half of an exposure threshold and a second exposure pass has a dose greater than half of the exposure threshold.

7. The method according to claim 1, wherein said method comprises 3 exposure passes or more, of which said dose is increased linearly for every following pass.

8. The method according to claim 1, wherein said method comprises 3 exposure passes or more, of which said dose is increased exponentially for every following pass.

9. The method according to claim 1, wherein said method comprises 3 exposure passes or more, of which said dose is increased logarithmically for every following pass.

10. The method according to any one of claims 1–9, wherein each portion of said workpiece is patterned with a first exposure pass before exposing a next exposure pass.

11. The method according to claim 10, wherein said portions are exposed in the same direction.

12. The method according to claim 10, wherein said portions are exposed in alternating directions.

13. The method according to claim 1, wherein the dose of a last exposure at a location on the workpiece is within the range of 40% to 60% higher than a first exposure at the location on the workpiece.

14. The method according to claim 1, wherein the dose of a last exposure at a location on the workpiece is within the range of 45% to 55% higher than a the first exposure at the location on the workpiece.

15. The method according to claim 1, wherein the coating sensitive to electromagnetic radiation is a chemically amplified resist (CAR).

16. The method according to claim 1, wherein said workpiece is a mask substrate.

17. The method according to claim 13, wherein four writing passes are used.

* * * * *